(12) United States Patent
Taubman (10) Patent No.: US 7,176,755 B2
(45) Date of Patent: Feb. 13, 2007

(54) TRANSISTOR-BASED INTERFACE CIRCUITRY

(75) Inventor: Matthew S. Taubman, Richland, WA (US)

(73) Assignee: Battelle Memorial Institute, Richland, WA (US)

( * ) Notice: Subject to any disclaimer, the term of this patent is extended or adjusted under 35 U.S.C. 154(b) by 0 days.

(21) Appl. No.: 10/757,332

(22) Filed: Jan. 13, 2004

(65) Prior Publication Data

US 2004/0145403 A1 Jul. 29, 2004

Related U.S. Application Data (62) Division of application No. 09/964,953, filed on Sep. 27, 2001, now Pat. No. 6,696,887.

(51) Int. Cl.
*G06G 7/12* (2006.01)
*G06G 7/26* (2006.01)

(52) U.S. Cl. .............. 327/560; 327/432; 327/514; 330/308

(58) Field of Classification Search ........ 327/514, 327/333, 432, 560, 561, 427; 330/308, 259, 330/270, 290
See application file for complete search history.

(56) References Cited

U.S. PATENT DOCUMENTS

| | | | | |
|---|---|---|---|---|
| 3,369,128 A | | 2/1968 | Pearlman | 327/350 |
| 3,566,131 A | * | 2/1971 | Franklin | 250/214 R |
| 3,648,051 A | * | 3/1972 | Weckler | 250/214 R |
| 4,097,767 A | | 6/1978 | Blackmer et al. | 327/104 |
| 4,250,462 A | | 2/1981 | Iwer et al. | 330/296 |
| 4,409,500 A | | 10/1983 | Welland | 327/538 |
| 4,498,001 A | | 2/1985 | Smoot | 250/214 A |
| 4,574,249 A | * | 3/1986 | Williams | 330/59 |
| 4,739,174 A | * | 4/1988 | Nagano | 250/551 |
| 4,761,661 A | | 8/1988 | Negishi | 347/247 |
| 4,771,431 A | | 9/1988 | Nakazawa et al. | 372/38 |
| 4,819,241 A | | 4/1989 | Nagano | 372/38.02 |
| 4,882,482 A | | 11/1989 | Smith et al. | 250/214 A |
| 4,963,727 A | * | 10/1990 | Cova | 250/214 R |
| 5,113,151 A | | 5/1992 | Yamamoto et al. | 372/38 |

(Continued)

FOREIGN PATENT DOCUMENTS

DE   1 588 321   11/1969

(Continued)

OTHER PUBLICATIONS

Philip C.D. Hobbs, *"Photodiode Front Ends"*, Optics & Photonics News, Apr. 2001.

(Continued)

*Primary Examiner*—Tuan T. Lam
(74) *Attorney, Agent, or Firm*—Klarquist Sparkman LLP (57) ABSTRACT

Among the embodiments of the present invention is an apparatus that includes a transistor, a servo device, and a current source. The servo device is operable to provide a common base mode of operation of the transistor by maintaining an approximately constant voltage level at the transistor base. The current source is operable to provide a bias current to the transistor. A first device provides an input signal to an electrical node positioned between the emitter of the transistor and the current source. A second device receives an output signal from the collector of the transistor.

20 Claims, 5 Drawing Sheets

U.S. PATENT DOCUMENTS

| | | | |
|---|---|---|---|
| 5,115,147 A | 5/1992 | Kusano et al. | 327/109 |
| 5,123,024 A | 6/1992 | Dowd et al. | 330/308 |
| 5,254,957 A | 10/1993 | Lauffenburger | 330/308 |
| 5,296,697 A * | 3/1994 | Moses, Jr. | 250/214 R |
| 5,304,793 A | 4/1994 | Grasset | 250/214 A |
| 5,304,949 A | 4/1994 | Chun | 330/296 |
| 5,432,474 A | 7/1995 | Lauffenburger et al. | 330/252 |
| 5,444,579 A * | 8/1995 | Klein et al. | 360/67 |
| 5,463,648 A | 10/1995 | Gibbs | 372/38.02 |
| 5,498,865 A | 3/1996 | Gaboury et al. | 250/214 A |
| 5,565,672 A | 10/1996 | Siegel et al. | 250/214 A |
| 5,596,444 A | 1/1997 | Eguchi | 359/210 |
| 5,646,560 A | 7/1997 | Nguyen | 327/199 |
| 5,724,170 A | 3/1998 | Aizawa | 398/197 |
| 5,734,293 A | 3/1998 | Gross | 327/561 |
| RE35,766 E | 4/1998 | Taguchi | 372/38.01 |
| 5,736,844 A | 4/1998 | Yanagisawa | 323/282 |
| 5,777,517 A | 7/1998 | Seshita | 330/277 |
| 5,796,278 A | 8/1998 | Osborn et al. | 327/108 |
| 5,796,767 A | 8/1998 | Aizawa | 327/108 |
| 5,848,044 A | 12/1998 | Taguchi et al. | 369/53.26 |
| 5,864,416 A * | 1/1999 | Williams | 398/202 |
| 5,878,015 A | 3/1999 | Schell et al. | 369/116 |
| 5,886,374 A | 3/1999 | Sakamoto et al. | 257/292 |
| 5,936,986 A * | 8/1999 | Cantatore et al. | 372/38.02 |
| 5,970,078 A | 10/1999 | Walker | 372/38.01 |
| 6,011,415 A | 1/2000 | Hahn et al. | 327/103 |
| 6,021,144 A | 2/2000 | Meyer et al. | 372/38.02 |
| 6,026,104 A | 2/2000 | Itou | 372/38.01 |
| 6,028,871 A | 2/2000 | Vaughan et al. | 372/38 |
| 6,044,095 A | 3/2000 | Asano et al. | 372/31 |
| 6,054,901 A | 4/2000 | Nainar et al. | 330/292 |
| 6,069,534 A | 5/2000 | Kobayashi | 330/308 |
| 6,091,748 A | 7/2000 | Yasuda | 372/38.02 |
| 6,111,901 A | 8/2000 | Taguchi et al. | 372/38.02 |
| 6,122,497 A | 9/2000 | Gilbert | 455/333 |
| 6,271,721 B1 | 8/2001 | Trask | 327/560 |
| RE37,524 E | 1/2002 | Taguchi | 372/29.011 |
| 6,344,762 B1 * | 2/2002 | Prentice | 327/65 |
| 6,392,215 B1 | 5/2002 | Baumgartner et al. | 250/205 |
| 6,545,540 B1 * | 4/2003 | Enriquez | 330/288 |
| 2003/0058034 A1 | 3/2003 | Taubman | 327/560 |

FOREIGN PATENT DOCUMENTS

| | | |
|---|---|---|
| EP | 1 011 193 A1 | 6/2000 |
| JP | 11026849 | 1/1999 |

OTHER PUBLICATIONS

K.G. Libbrecht, and J.L. Hall, "*A low-noise high-speed diode laser current controller*", American Institute of Physics, 1993.

* cited by examiner

TRANSISTOR-BASED INTERFACE CIRCUITRY

CROSS-REFERENCE TO RELATED APPLICATIONS

The present application is a divisional of U.S. patent application Ser. No. 09/964,953 filed 27 Sep. 2001, now U.S. Pat. No. 6,696,887, which is hereby incorporated by reference.

GOVERNMENT RIGHTS

This invention was made with Government Support under Contract Number DE-AC0676RL01830. The Government has certain rights in the invention.

BACKGROUND

The present invention relates to electrical circuitry, and more particularly, but not exclusively, relates to interface circuits including a transistor.

The ongoing desire for faster circuitry with fewer components has fueled a need for better ways to interface various circuits and circuitry components. Improved interfacing for electro-optical devices, such as photodetectors and laser generating components, is of particular interest. Proposed interface circuits for certain photodectors typically limit the available frequency response and/or signal-to-noise ratio of such devices. In other proposed arrangements, interfaces between certain laser generating components and one or more corresponding input signal sources often include complicated filter networks in an attempt to provide adequate impedance matching. Besides electro-optics, other applications would also benefit from better interfacing. Thus, there is a demand for further advancement in this area of technology.

SUMMARY OF INVENTION

As used herein, "transistor device" broadly refers not only to a single transistor, but also to a transistor combined with one or more other electronic elements to provide an active device that includes at least three terminals. By way of nonlimiting example, transistor device includes multiple transistor combinations, such as two or more transistors connected in parallel, the Darlington configuration, and the Sziklai configuration, to name a few; or different configurations including at least one transistor as would occur to one skilled in the art. Further, as used herein, "transistor" broadly refers to any transistor type, including, but not limited to, a Bipolar Junction Transistor (BJT), Junction Field Effect Transistor (JFET), Insulated Gate Field Effect Transistor (IGFET) (where IGFETs include Metal Oxide Semiconductor Field Effect Transistor (MOSFET) types). Also as used herein, "common base" or "common gate" refers to a transistor device for which input and output signals of interest are each associated with a transistor device terminal other than a base or gate.

One embodiment of the present invention includes a unique interface circuit. Other embodiments include unique circuits, systems, devices, apparatus, and methods for interface circuitry.

In a further embodiment, interface circuitry includes a transistor device in a common base or common gate configuration. This configuration can include a servo device that receives feedback from one terminal of the transistor device to maintain a relatively constant level at that terminal.

Still a further embodiment of the present invention includes a transistor device in a common base or common gate configuration that amplifies an input signal from a photodetector. A transistor emitter is coupled to the photodetector to receive the input signal and an output is provided from a transistor collector. An operational amplifier can be included with an output operable to drive a transistor base and a negative input coupled to the transistor emitter.

Yet another embodiment of the present invention includes: controlling operation of a transistor device in a common base or gate mode with a servo device; providing negative feedback from a first terminal of the transistor device to a first input of the servo device; providing a selected voltage level to a second input of the servo device; and biasing another device coupled to the first terminal in accordance with the selected voltage level.

Another embodiment of the present invention includes: operating a transistor device in a common base or gate configuration; coupling two or more input signal pathways to the transistor device; and providing an output to another device from the transistor device. In one form, this other device is of a laser-generating type.

For another embodiment, a transistor device includes an emitter, a base, and a collector, that is arranged in a common base configuration to maintain the emitter at a predefined voltage. A number of input signal pathways are coupled to the emitter and a current-dependent load is coupled to the collector. This load is responsive to an input signal received through one of the input signal pathways.

Circuitry of a further embodiment of the present invention includes a transistor device operated in a common base or gate configuration to provide a virtual ground at a first terminal, and a laser device electrically coupled to a second terminal of the transistor device. Operation of the laser device is controlled with one or more input signals provided to the first terminal of the transistor.

Yet a further embodiment of the present invention includes: controlling a common base or common gate mode of operation of a transistor device with a servo device, where the servo device provides an output to the transistor device and receives feedback from the transistor device; applying an approximately constant bias current to the transistor device with a current source; receiving an input signal at an electrical node between a first terminal of the transistor device and the current source; and providing an output signal from the transistor device.

One object of the present invention is to provide a unique interface circuit.

Another object of the present invention is to provide a unique interface circuit, system, device, apparatus, or method.

Further objects, embodiments, forms, features, advantages, benefits, and aspects of the present invention shall become apparent from the detailed description and drawings provided herewith.

DETAILED DESCRIPTION OF SELECTED EMBODIMENTS

While the present invention may be embodied in many different forms, for the purpose of promoting an understanding of the principles of the invention, reference will now be made to the embodiments illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates.

Figure 1:
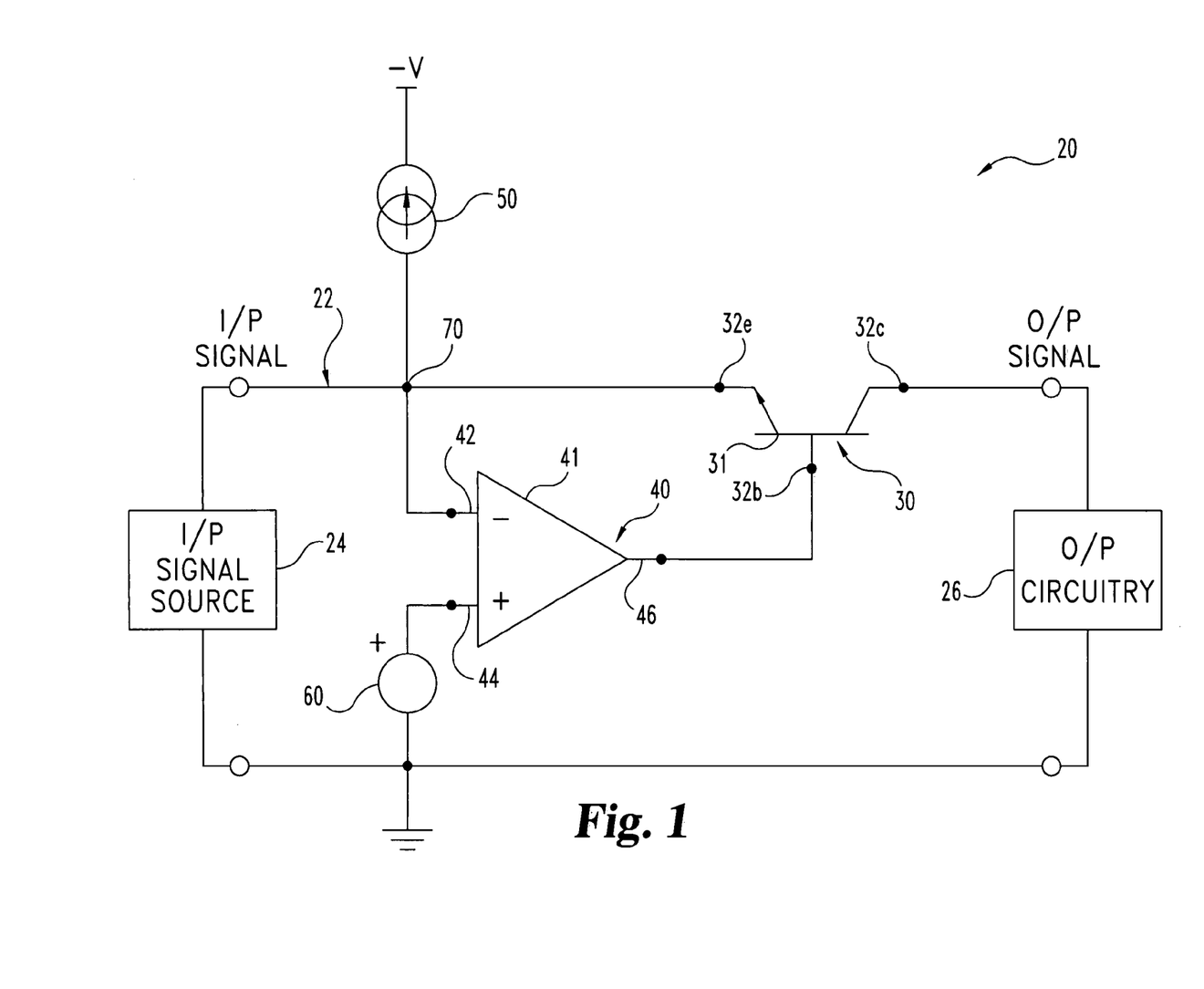
FIG. 1 is a schematic of an interface circuit of one embodiment of the present invention.

FIG. 1 schematically illustrates circuit 20 of one embodiment of the present invention. Circuit 20 includes interface circuitry 22, input (I/P) signal source 24 operable to provide an input signal to interface circuitry 22, and output (O/P) circuitry 26 responsive to an output signal from interface circuitry 22. Interface circuitry 22 changes various characteristics of the input signal for output to O/P circuitry 26 as compared to the provision of this input signal to O/P circuitry 26 directly from I/P signal source 24. Interface circuitry 22 includes transistor device 30, servo device 40, current source 50, and voltage source 60. Signal source 24, transistor device 30, servo device 40, and current source 50 are electrically coupled at a common input node 70 of interface circuitry 22.

Transistor device 30 is in the form of NPN bipolar junction transistor 31. Transistor 31 includes base 32b electrically coupled to servo device 40, collector 32c electrically coupled to O/P circuitry 26, and emitter 32e electrically coupled to input node 70. Servo device 40 includes operational amplifier (op-amp) 41 with negative op-amp input 42, positive op-amp input 44, and op-amp output 46. Negative op-amp input 42 is electrically coupled to emitter 32e and signal I/P source 24 via input node 70. Positive op-amp input 44 is electrically coupled to voltage source 60, and op-amp output 46 is electrically coupled to base 32b of transistor 31.

Current source 50 is coupled to a voltage supply (−V) that is negative relative to electrical ground. Current source 50 provides an approximately constant current with compliance suitable to the particular application. Current source 50 can be arranged to permit for adjustment of the output current level by an operator or otherwise, or can be of a fixed, nonadjustable output variety.

Input signal source 24, output circuitry 26, and voltage source 60 are commonly grounded. Voltage source 60 provides a voltage level to positive op-amp input 44 that is positive relative to electrical ground. Voltage source 60 provides an approximately constant voltage output with a degree of regulation suitable for the particular application. Voltage source 60 can be arranged to permit for adjustment of the output voltage level by an operator or otherwise, or can be of a fixed, nonadjustable variety.

During operation, an I/P signal from I/P signal source 24 is applied to emitter 32e and a corresponding O/P signal is provided to O/P circuitry 26 from collector 32c. Transistor device 30 and servo device 40 are configured to operate in a common base mode such that base 32b remains a generally common reference point relative to the V/P signal at emitter 32e and the O/P signal at collector 32c. Operational amplifier 41 adjust op-amp output 46, and correspondingly drives base 32b to maintain the voltage difference between negative op-amp input 42 and positive op-amp input 44 close to zero. Accordingly, negative op-amp input 42 receives negative feedback from emitter 32e, resulting in a voltage level at emitter 32e corresponding to that provided to positive op-amp input 44 by voltage source 60. Furthermore, it should be understood that the electric current drawn by negative op-amp input 42 is relatively low compared to the current flow from emitter 32e to collector 32c of transistor device 30. Current source 50 provides an appropriate bias current to maintain transistor device 30 in a generally linear conductive range for the common base configuration.

The common base mode of operation provides a way to isolate reactance characteristics of signal source 24 from O/P circuitry 26 and corresponding provide impedance matching/transformation. Typically, the input impedance of emitter 32e is significantly lower than the output impedance of collector 32c, which can be desirable for high frequency input signal conditioning and/or signal amplification, among others. When voltage source 60 provides a nonzero voltage to positive op-amp input 44, node 70 is maintained at a comparable nonzero voltage. This voltage can be used to bias certain passive forms of signal source 40, such as a sensor or detector. In another arrangement, voltage source 60 can be at a zero level relative to ground, which could be alternatively represented by an electrical short or resistance connection from positive op-amp input 44 to electrical ground. For this arrangement, operational amplifier 41 acts to make the voltage difference between positive op-amp input 44 and negative op-amp input 42 approach zero, so that a virtual ground is realized at input node 70. This virtual ground arrangement can be used to provide control signals from I/P signal source 24 to O/P circuitry 26 while isolating undesirable characteristics of I/P signal source 24 from O/P circuitry 26.

Figure 2:
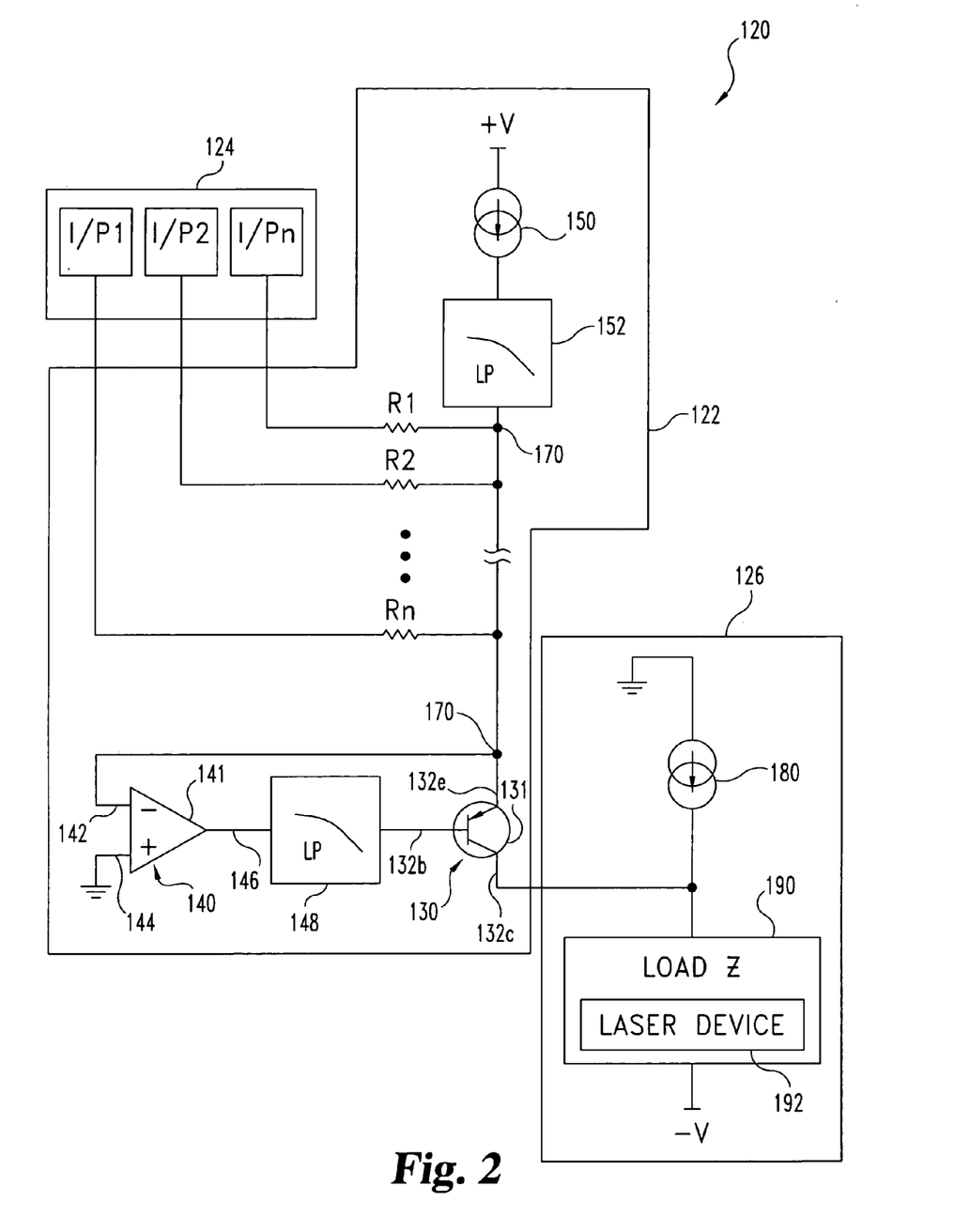
FIG. 2 is a schematic of circuitry of another embodiment of the present invention arranged to interface one or more signals with an electrical load.

FIG. 2 schematically illustrates circuit 120 of another embodiment of the present invention. Circuit 120 includes interface circuit 122, input signal sources I/P1, I/P2, . . . I/Pn (collectively designated I/P devices 124), and output circuitry 126. Input devices 124 provide signals to output circuitry 126 via interface circuit 122. Input devices 124 can provide two or more signals simultaneously, such that they are summed together by interface circuit 122, or signals may be provided by different input devices 124 at different times. While three input devices 124 are shown in FIG. 2, it should be understood that the ellipse positioned between I/P2 and I/Pn represents the optional presence of more input devices 124. In still other embodiments, two or less input devices 124 could be utilized.

Interface circuit 122 includes transistor device 130 and servo device 140 configured for a common base mode of operation. Transistor device 130 includes PNP transistor 131 with base 132b, collector 132c, and emitter 132e. Servo device 140 includes operational amplifier 141 with negative op-amp input 142 coupled to input node 170 and, positive op-amp input 144 at ground. Operational amplifier 141 also includes op-amp output 146 electrically coupled to base 132b of transistor device 130 via low pass (LP) filter 148. Transistor device 130 and servo device 140 operate as described in connection with transistor device 30 and servo device 40 of FIG. 1. It should be appreciated that positive op-amp input 144 could be tied directly to ground as illustrated, or through a resistor as is commonly desired for many operational amplifier devices. Likewise, low pass filter 148 may not be present, but it can be desired for certain applications to reduce noise and provide a smoother response.

Input node 170 is common to emitter 132e and input resistors R1, R2, . . . Rn. As illustrated, input node 170 is directly connected to negative op-amp input 142; however, in other embodiments, an interfacing passive component, such as a resistor, or network of passive components could be used to couple input node 170 to negative op-amp input 142. Bias current is applied to transistor device 130 by current source 150 via a noise reducing low pass filter 152 coupled in series with current source 150. Current source 150 provides an approximately constant current with a degree of compliance suitable to the particular application. Current source 150 can be arranged to permit adjustment of output current by an operator or otherwise, or can be of a nonadjustable, fixed variety.

O/P circuitry 126 includes current source 180 and load (Z) 190. Load 190 includes laser generating device 192. In one form, laser device is of a current-dependent load type, such as a quantum cascade laser, and current source 180 is of a variable type arranged as the main current drive for load 190. In other embodiments, load 190 and device 192 may be in the form of a laser diode or other laser generator, and/or include a different type of load.

The coupling of positive op-amp input 144 to ground provides a virtual ground at negative op-amp input 142 and correspondingly input node 170. Signals input to emitter 132e from any of input devices 124 are combined and output to load 190 from collector 132c. The isolation characteristic of interface circuit 122 permits the combination of signals operating with different voltage supply rails—such that amplifiers operating off a plus/minus five (+/−5) volt supply can be combined with those operating off a plus/minus fifteen (+/−15) volt supply. Additionally or alternatively, high frequency modulation signals for load 190 can be added to other relatively slow-changing control signals without the need for complex interfacing filter networks.

Figure 3:
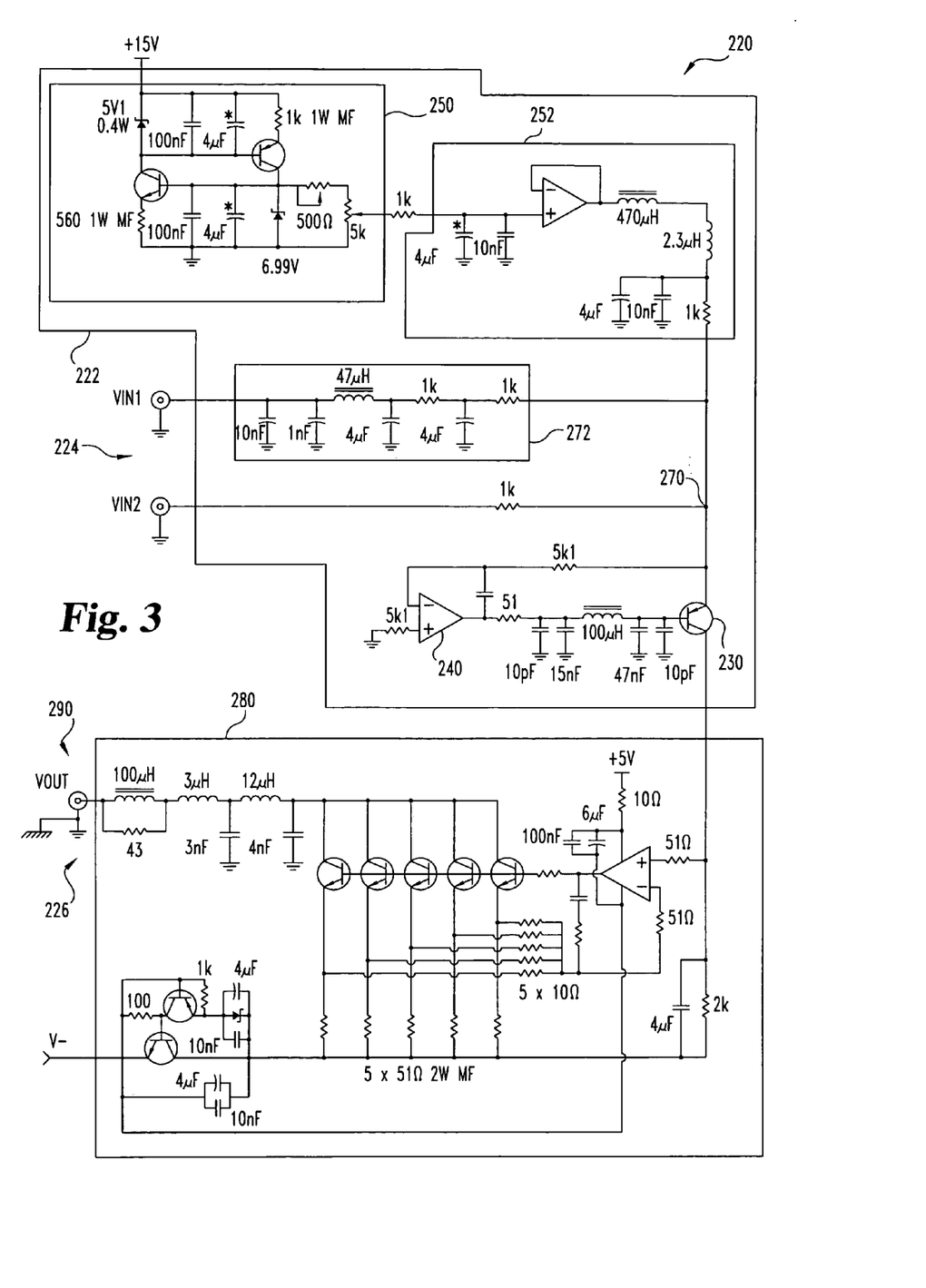
FIG. 3 is a schematic showing greater detail of one form of the embodiment shown in FIG. 2.

FIG. 3 schematically illustrates circuitry 220 of another embodiment of the present invention. Circuitry 220 includes interface circuitry 222, two (2) inputs VIN1 and VIN2 (collectively designated inputs 224) that are supplied by sources not shown, and output circuitry 226. Inputs 224 can be provided by devices such as devices 124 of circuit 120. Interface circuit 222 includes transistor device 230 and servo device 240 arranged for a common base mode of operation as previously described for transistor device 30 and 130 and servo device 40 and 140 for circuit 20 and 120, respectively. Interface circuit 222 further includes current source circuit 250 and low pass filter circuit 252 coupled in series to input node 270. Input node 270 is electrically connected to the emitter of transistor device 230 and coupled to the negative input of servo device 240. The positive input of servo device 240 is tied to ground via a resistor to provide a virtual ground at input node 270 as explained in connection with circuit 120. Input VIN1 is coupled to input node 270 via filter 272 and input VIN2 is coupled to input node 270 via an input resistor.

Output circuitry 226 includes a current source circuit 280 and load output VOUT (also designated by reference numeral 290). The output from the collector of transistor device 230 is provided to current source circuitry 280, which in turn, provides output VOUT to an electrical load (not shown). In one form, VOUT drives a laser device of a current-dependent variety, such as a quantum cascade type. For this form, current source circuitry 280 is arranged to provide a desired load current that is modulated/controlled by signals from inputs 224. VIN1 can be a 0–20 control voltage and VIN2 can be provided as a sweep signal for such a form. This arrangement provides for the input of control signals at inputs 224, while isolating undesirable reactance characteristics from the load coupled to output VOUT.

Figure 4:
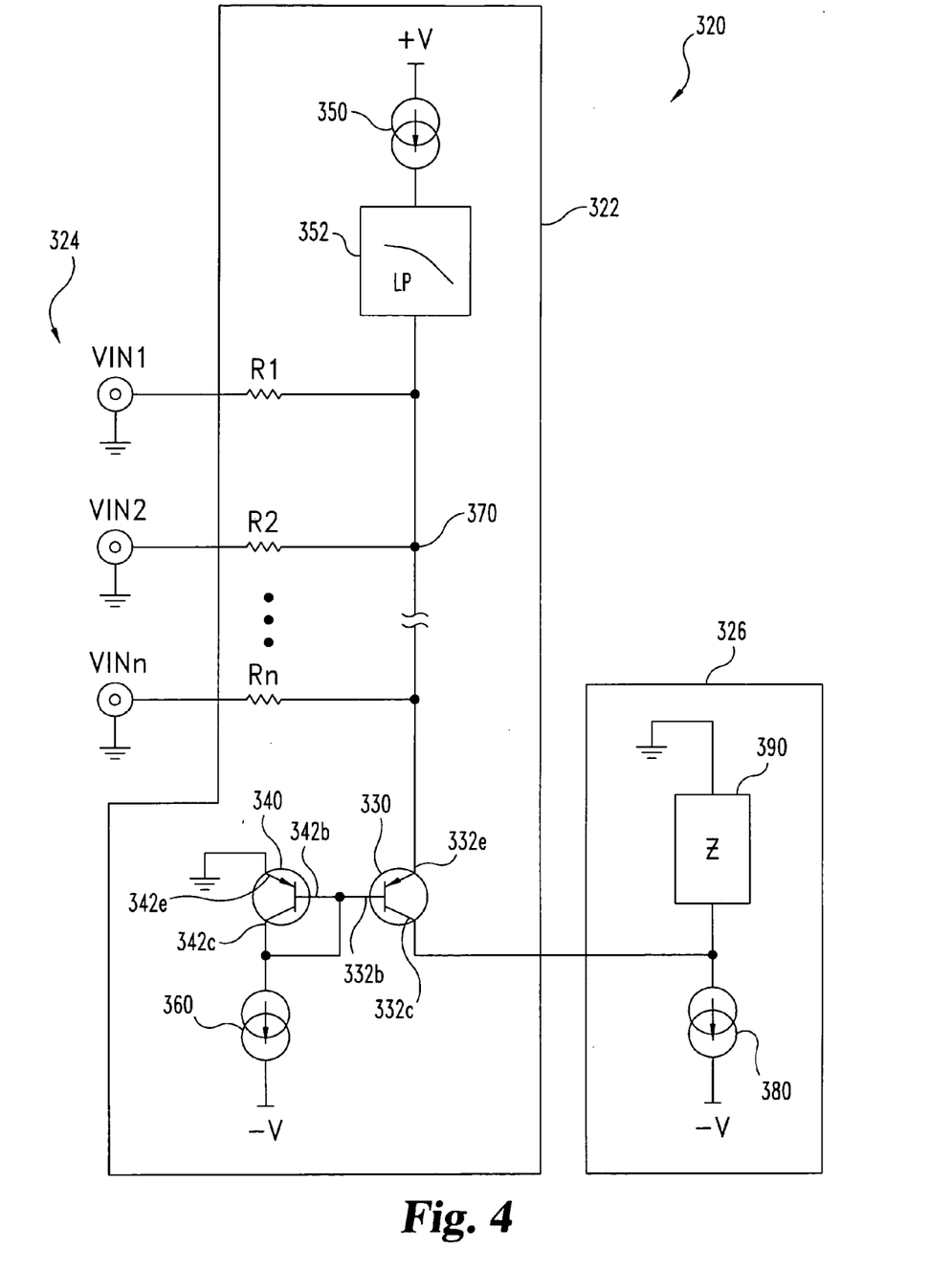
FIG. 4 is a schematic illustrating interface circuitry of still another embodiment of the present invention.

FIG. 4 schematically illustrates circuitry 320 of yet another embodiment of the present invention. Circuitry 320 includes interface circuit 322; inputs 324 (individually designated as VIN1, VIN2, . . . VINn); and output circuitry 326. Inputs 324 each provide a signal to output circuitry 326 via interface circuit 322, and can be supplied by one or more input sources or devices (not shown). Signals from two or more inputs 324 received simultaneously can be summed together with interface circuit 322. While three inputs 324 are shown in FIG. 4, it should be understood that the vertical ellipse positioned between VIN2 and VINn represents the optional presence of more inputs 324. In other embodiments, two or less inputs 324 can be utilized.

Interface circuit 322 includes PNP transistor 330 arranged for a common base mode of operation in conjunction with PNP transistor 340. Transistor 330 includes base 332b, collector 332c, and emitter 332e. Transistor 340 includes base 342b and collector 342c electrically coupled together with base 332b of transistor 330. Transistor 340 also includes emitter 342e coupled to ground. Bases 332b and 342b, and collector 342c are commonly coupled to biasing current source 360. Current source 360 is arranged to provide a biasing current for the operation of the transistor 340. The interconnection of transistors 330 and 340 maintains input node 370 of interface circuitry 322 (and correspondingly emitter 332e) at about the same electrical potential as emitter 342e, except for differences that might arise due to different transistor sizes, collector currents, junction temperatures, and the like. Accordingly, a virtual ground is approximated at input node 370 by this arrangement.

Input node 370 is also coupled to input resistors R1, . . . ,Rn; and a noise reducing low pass filter 352. Low pass filter 352 is coupled in series with biasing current source 350. Current sources 350 and 360 each provide an approximately constant biasing current with a degree of compliance suitable to the particular application. Current source 350 and/or current source 360 can be arranged to permit adjustment of output current by an operator or otherwise, or can be of a nonadjustable, fixed variety.

Output circuitry 326 includes current source 380 and load (Z) 390. Load 390 can be of a current-dependent type, such as a quantum cascade laser, a different laser generating arrangement, and/or a different load type as would occur to those skilled in the art. The coupling of load 390 to inputs 324 via the virtual ground provided by interface circuit 322 provides a way to interface dissimilar signals, isolate undesirable electrical characteristics, such as reactance, and/or match/convert impedance of desired signals. In one form, circuitry 320 is applied to interface a current-dependent laser generating device with control/modulation signals provided from one or more other devices via inputs 324.

Figure 5:
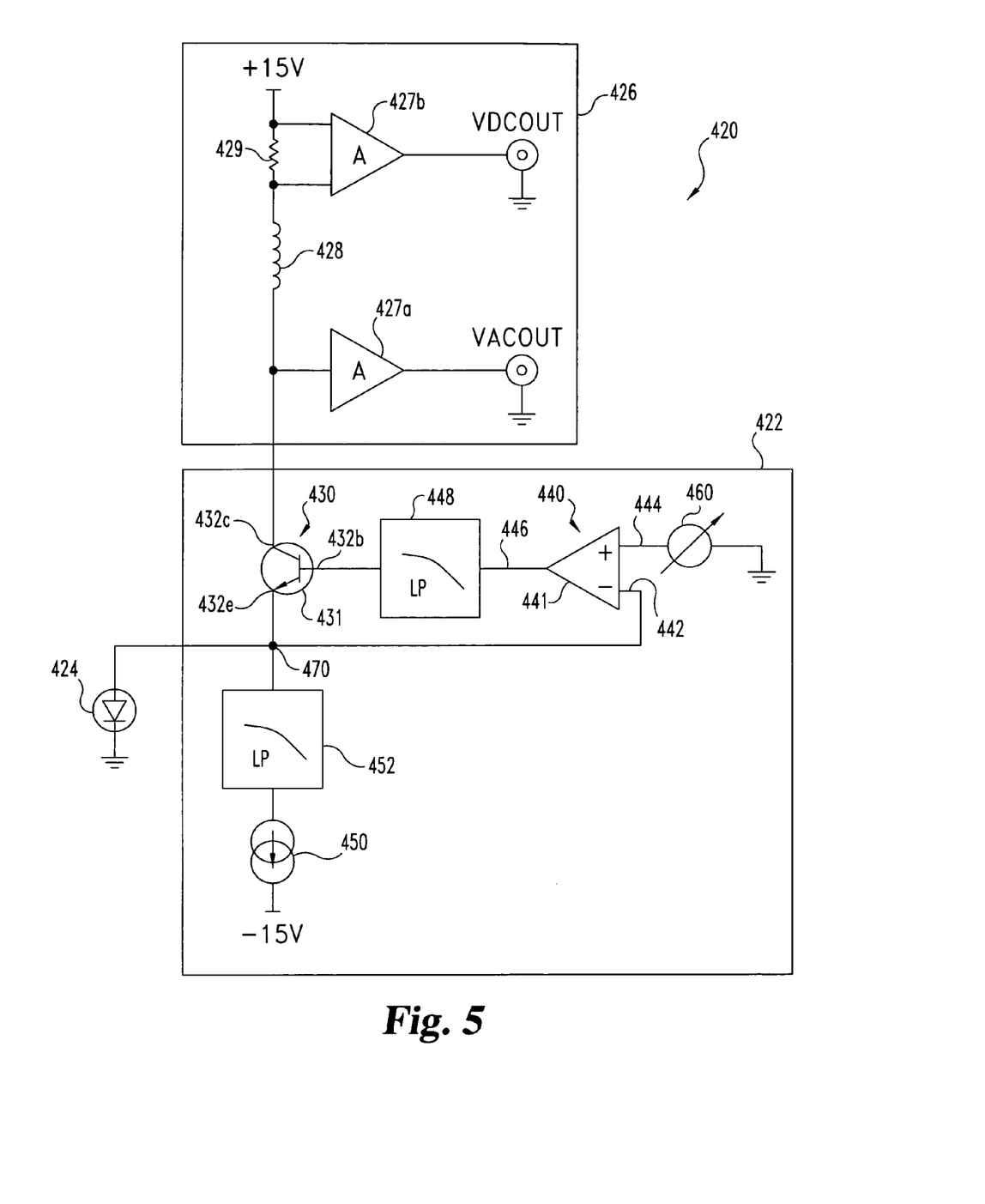
FIG. 5 is a schematic illustrating interface circuitry for a photodiode sensor of yet another embodiment of the present invention.

Still another embodiment of the present invention is schematically illustrated as circuitry 420 in FIG. 5. Circuitry 420 includes preamplifier 422 for photodetector 424 and output circuit 426. Photodetector 424 provides a signal indicative of a level of impinging photons. In one form, photodetector 424 is of Mercury-Cadmium-Telluride (MCT) type used for long-wave infrared wavelength detection. In other forms, photodetector 424 can be of a different type, including, but not limited to a silicon-based sensor typically used to detect visible light, an Indium-Galium-Arsenide (InGaAs) type often used for near infrared detection, or such different type as would occur to those skilled in the art. Interface circuitry 422 includes transistor device 430 coupled to servo device 440 to operate in the fashion previously described in connection with transistor device 30 and servo device 40 of circuit 20. Transistor device 430 includes PNP transistor 431 with base 432*b*, collector 432*c*, and emitter 432*e*. Servo device 440 includes operational amplifier 441 with negative op-amp input 442, positive op-amp input 444, and op-amp output 446. Op-amp output 446 is coupled to low pass filter 448 to drive base 432*b* of transistor 431. Emitter 432*e* is coupled to input node 470 to receive input signals from photodetector 424. Input node 470 is also coupled to negative op-amp input 442 to provide negative feedback. Positive op-amp input 444 is coupled to variable voltage source 460. Current source 450 and low pass filer 452 are coupled in series to input node 470 to provide an approximately constant biasing current to the transistor device 430 with a current source compliance suitable for the particular application. As explained in connection with circuit 20, op-amp 441 operates to maintain voltage at node 470 at a value close to that input at positive op-amp input 444 by voltage source 460. Accordingly, voltage source 460 can be adjusted to provide a desired biasing voltage level for photodetector 424. Voltage source 460 is regulated to a degree suitable for the particular application and, like current source 450, can be of a type that is adjustable by an operator or otherwise, or has a nonadjustable, fixed output.

Collector 432*c* provides an amplified output of the input from photodetector 424 to emitter 432*e*. Output circuitry 426 also includes Alternating Current (AC) amplifier 427*a*. An AC voltage input to AC amplifier 427*a* develops across inductor 428, while also providing for the flow of an appropriate bias current to transistor device 430. AC amplifier 427*a* of circuit 426 provides an AC output, VACOUT. Output circuitry 426 also includes Direct Current (DC) amplifier 427*b* and sense resistor 429. The input to DC amplifier 427*b* is developed across sense resistor 429, such that measurement of the current flow comprised of the bias current through transistor device 430 in addition to the current presented by photodetector 424 can be amplified. DC amplifier 427*b* of circuit 426 provides a DC output, VDCOUT. Signals VACOUT and/or VDCOUT can be further utilized by communications circuitry, sensing circuitry, or such different applications as would occur to those skilled in the art.

The arrangement of circuit 420 provides a bias voltage for photodetector 424 while at the same time isolating its reactance characteristics from output circuitry 426. In one form, photodetector 424 is of an MCT variety and amplifier 427*a* is of a high frequency, high performance 50 ohm strip line amplifier type such that performance is comparable to the intrinsic capacitance of photodetector 424. This arrangement finds application in digital communications, among others. In other embodiments, a different type of photodetector and/or amplifier could be utilized. In still other embodiments, a sensor for detecting electromagnetic radiation other than light, a substance, and/or a different property/characteristic could be used instead of or in addition to photodetector 424.

Referring generally to FIGS. 1–5, it should be appreciated that in other embodiments, instead of a single transistor, a transistor device that combines one or more transistors and/or one or more other active devices, including combinations of two or more transistors, could be utilized. Furthermore, it should be understood that in place of one or more Bipolar Junction transistor (BJT) types illustrated, a Field Effect Transistor (FET) type could be utilized. In such a case, an FET gate is used instead of the base, an FET source is used in place of one of the collector and emitter, and an FET drain is used in place of the other of the collector and emitter. For embodiments utilizing a BJT-based transistor device in a common base configuration or operating mode, an FET-based transistor device can be used instead of the BJT-based transistor device, with such FET-based transistor device correspondingly being in a common gate configuration or operating mode.

In still other forms, a servo device utilized in accordance with the present invention may alternatively or additionally include other types of circuit arrangements in addition to or as an alternative to an operational amplifier. In one such example, a differential input amplifier of discrete components is utilized in place of an operational amplifier. Moreover, in yet other embodiments, different applications and combinations of the circuits shown in the respective embodiments are utilized.

Any theory, mechanism of operation, proof, or finding stated herein is meant to further enhance understanding of the present invention, and is not intended to limit the present invention in any way to such theory, mechanism of operation, proof, or finding. While the invention has been illustrated and described in detail in the drawings and foregoing description, the same is to be considered as illustrative and not restrictive in character, it being understood that only selected embodiments have been shown and described and that all equivalents, changes, and modifications that come within the spirit of the inventions as defined herein or by the following claims are desired to be protected.

What is claimed is:

1. An apparatus, comprising:
a transistor device including a first terminal that is an emitter, a second terminal that is a base, and a third terminal that is a collector, said transistor device being in a common base configuration arranged to maintain said emitter at a predefined voltage;
two or more input signal pathways coupled to said first terminal;
a lowpass filter coupled to the second or base terminal of the transistor device; and
an AC output and a DC output from the third terminal of the transistor device for connection to a load, the AC output being a separate output from the DC output.

2. The apparatus of claim 1, wherein one of the AC output and the DC output is coupled to a laser diode.

3. The apparatus of claim 1, wherein one of the AC output and the DC output is coupled to a quantum cascade laser configuration.

4. The apparatus of claim 1, further comprising an operational amplifier to control said transistor device, said operational amplifier including a negative input coupled to receive feedback from said emitter, a positive input coupled to ground, and an output configured to drive said base.

5. The apparatus of claim 1, further comprising a different transistor device coupled to said base, said different transistor device including an emitter coupled to ground.

6. The apparatus of claim 1, further comprising a control signal generator coupled to one of said inputs.

7. The apparatus of claim 1, further comprising a current source coupled to the emitter.

8. A method, comprising:
operating a transistor device with first, second and third terminals in a common base or common gate configuration;

coupling two or more input signal pathways to a first terminal of the transistor device;
coupling a lowpass filter to a second or base terminal of the transistor device; and
providing an AC output and a DC output from a third terminal of the transistor device for connection to a load, the AC output being a separate output from the DC output.

9. The method of claim 8, further comprising:
providing a virtual ground at the first terminal of the transistor device through a current path to the virtual ground; and
coupling a current-dependent load to one of the outputs, wherein one of the input signal pathways is from a current source with a lowpass filter, the filter comprising active and passive components.

10. The method of claim 8, further comprising:
controlling the transistor device with a servo device;
providing a virtual ground at the first terminal of the transistor device through a servo device terminal; and
providing feedback to the servo device from the first terminal of the transistor device.

11. The method of claim 10, wherein the servo device includes an operational amplifier having a negative input and a positive input, and further comprising:
receiving the feedback through the negative input; and
coupling the positive input to ground.

12. The method of claim 8, wherein the first terminal corresponds to an emitter, and the third terminal corresponds to a collector, the method further including coupling a different transistor device to the base, the different transistor device including a ground-coupled emitter.

13. The method of claim 8, wherein the load includes a laser device, and which further includes providing a control voltage to a first one of the input signal pathways and a sweep voltage to a second one of the input signal pathways.

14. The method of claim 8, wherein the load includes a laser device and wherein one of the two or more input signal pathways is from a first current source, the method further comprising:
supplying an approximately constant bias current to the transistor device from the first current source; and
providing electrical current to the laser device from a second current source.

15. The method of claim 8, further comprising:
providing a virtual ground at a first terminal of the transistor device, wherein the virtual ground is provided by a servo device terminal, and wherein no reactive components are positioned between the first terminal of the transistor device and the servo device terminal;
wherein one of the input signal pathways is from a current source with a lowpass filter, the filter comprising active and passive components;
electrically coupling a laser device to the third terminal of the transistor device through one of the AC output and the DC output; and
controlling operation of the laser device with an input signal provided to the first terminal of the transistor device.

16. The method of claim 8, wherein said operating includes controlling operation of the transistor device with a servo device, the servo device receiving feedback from the first terminal.

17. The method of claim 15, wherein the current source is a first current source, the method further comprising:
supplying an approximately constant bias current to the transistor device from the first current source; and
providing electrical current to the laser device from a second current source.

18. The method of claim 8, wherein said operating includes regulating operation of the transistor device with a different transistor device having an emitter coupled to ground, the transistor device and the different transistor device having a base connection in common.

19. The method of claim 8, wherein the transistor device is a first transistor device, wherein the first terminal corresponds to an emitter and the third terminal corresponds to a collector, the method further comprising coupling a second transistor device to the base, the second transistor device comprising a ground-coupled emitter.

20. The method of claim 8, wherein one of the input signal pathways comprises a photodiode.

* * * * *